United States Patent [19]

Haque

[11] 4,385,286
[45] May 24, 1983

[54] USE OF SINGLE REFERENCE VOLTAGE FOR ANALOG TO DIGITAL OR DIGITAL TO ANALOG CONVERSION OF BIPOLAR SIGNALS

[75] Inventor: Yusuf A. Haque, Santa Clara, Calif.

[73] Assignee: American Microsystems, Inc., Santa Clara, Calif.

[21] Appl. No.: 169,980

[22] Filed: Jul. 18, 1980

[51] Int. Cl.³ .............................................. H03K 13/02
[52] U.S. Cl. ......................... 340/347 AD; 340/347 M; 340/347 C
[58] Field of Search .... 340/347 M, 347 AD, 347 DA

[56] References Cited

U.S. PATENT DOCUMENTS 4,195,282 3/1980 Cameron ..................... 340/347 AD
4,200,863 4/1980 Hodges et al. ............... 340/347 AD

OTHER PUBLICATIONS

Haque et al., A Two Chip PCM CODEC with Filters, IEEE Journal of Solid-State Circuits, vol. SC014, No. 6, 12/1979, pp. 961-969.

Primary Examiner—T. J. Sloyan

Attorney, Agent, or Firm—Alan H. MacPherson; Steven F. Caserza; Richard Franklin

[57] ABSTRACT

In an analog to digital converter circuit for a CODEC a single reference voltage is used for comparing both positive and negative input signals. The circuit comprises a capacitor array to define the decision levels corresponding to the end points of companding elements with the top plates of all capacitors in the array being connected in parallel through a single switch from an incoming analog signal source and to one input of a comparator. The bottom plate of each capacitor is connected to one of a series of three-way switches, all of which have separate terminals connected to the output of a voltage reference, to separate switches on a linear resistor string connected to the voltage reference output, and to ground. All switches are controlled by control logic connected to the comparator output. Analog to digital conversion is achieved by zeroing the voltage on the top plate of a selected capacitor in the array when the voltage on its lower plate is manipulated by signals from the control logic operating the switches in the linear resistor string selectively. By properly sequencing the switching of capacitors in the array, a single reference voltage is used.

7 Claims, 1 Drawing Figure

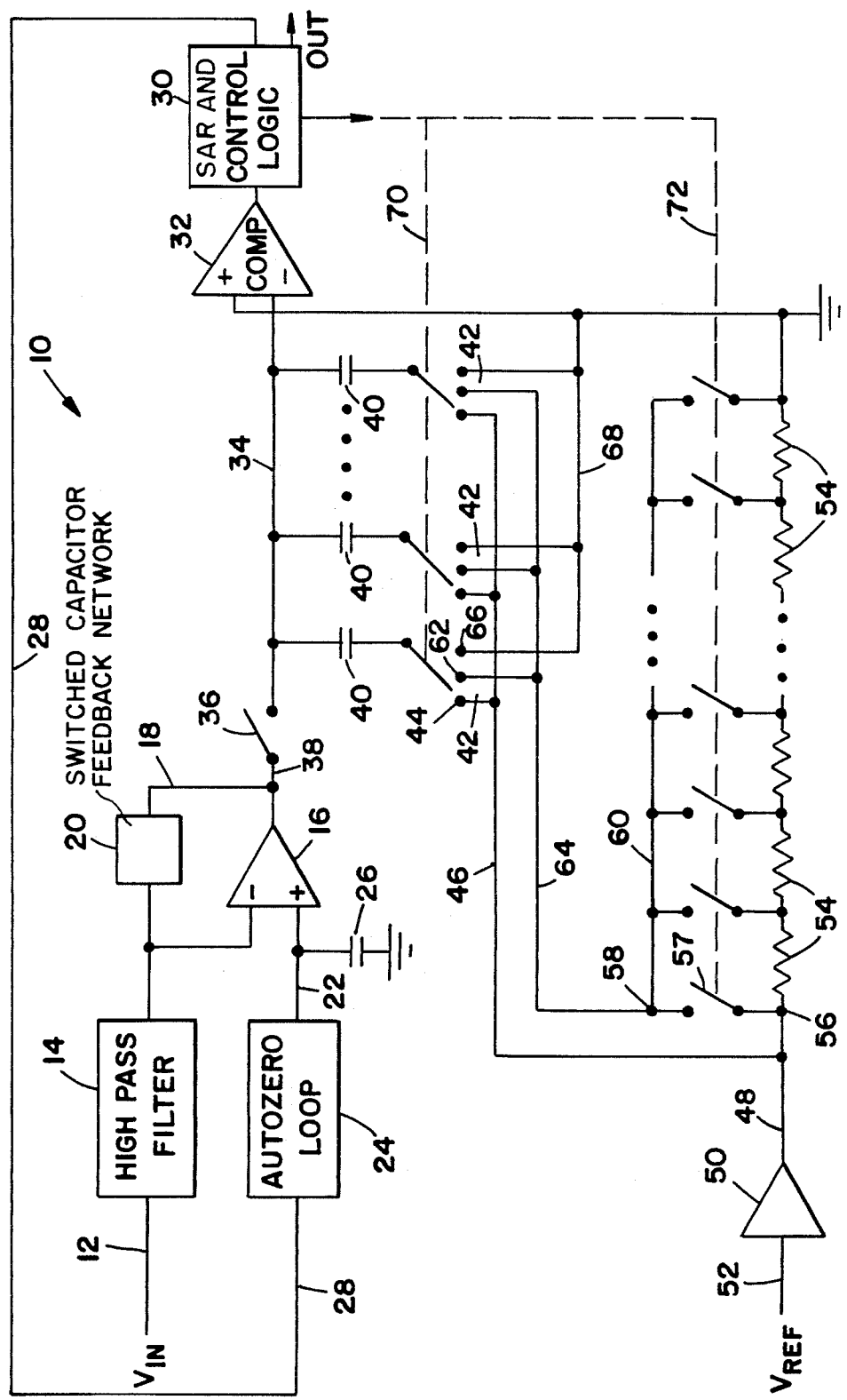

USE OF SINGLE REFERENCE VOLTAGE FOR ANALOG TO DIGITAL OR DIGITAL TO ANALOG CONVERSION OF BIPOLAR SIGNALS

BACKGROUND OF THE INVENTION

This invention relates to electronic circuits for digital signal processing and more particularly to the use of a single reference voltage for both positive and negative voltage swings with such circuits.

In many different circuits, such as a CODEC (Coder-Decoder), an analog signal is compared to a reference voltage where the amplitude of the analog signal can be less than or equal to the reference voltage. A CODEC essentially comprises a nonlinear analog to digital (A/D) converter and a nonlinear digital to analog (D/A) converter. These A/D and D/A functions involve both positive and negative signal voltages. Heretofore, this required the use of two reference voltages of equal magnitude, one for positive and another for negative signals. This often created problems or disadvantages because it required the two reference voltages to be matched—a condition that is difficult and expensive to provide.

Various approaches have been suggested for overcoming the two reference requirements. For example, in a paper entitled "A Two-Chip PCM CODEC for Per Channel Applications", James B. Cecil, Edwin M. W. Chow, John A. Flink and James E. Solomon, IEEE International Solid State Circuits Conference, February 1978, pp. 176–177, an arrangement was described wherein two references were generated from one reference. However, this had the disadvantage that (a) the two reference values generated may not be matched; and (b) it requires extra circuitry to generate the other reference. In another approach, as described in "A Two-Chip CMOS CODEC", George F. Landsburg, George Smarandoui, IEEE International Solid State Circuit Conference, February 1978, pp. 180–181, the authors used two separate off-chip references which had the same disadvantages as the first approach. In still another arrangement described in "A PCM Voice CODEC With On-Chip Filters", J. Terry, T. Caves, Chong H. Chan, Stanley D. Rosenbaum, Lester Sellars, John B. Terry, IEEE International Solid State Circuits Conference, February 1978, pp. 182–183, the authors essentially generated two reference voltages using resistive dividers. Thus, any errors present in the resistance values of the divider inevitably showed up as errors in the reference voltage.

It is, therefore, a general object of the present invention to provide a method for using a single reference voltage with A/D or D/A circuits that previously required two voltage references and which overcomes the disadvantages of prior attempts to solve the problem.

Another more specific object of the invention is to provide a single reference voltage circuit that may be made as an integrated circuit semiconductor device for implementing digital to analog or analog to digital conversion of positive or negative signals.

Further objects of the invention are to provide D/A and/or A/D electronic circuits using a single reference voltage that are more accurate, that require less silicon area on an integrated circuit chip; and are more economical to manufacture.

BRIEF SUMMARY OF THE INVENTION

In accordance with the principles of the invention, a single reference voltage system for a CODEC (A/D portion) utilizes a capacitor array to define the decision levels corresponding to the end points of the companding segments. The top plates of all capacitors in the array are connected in parallel through a single switch from the analog signal source and to the negative input of a comparator. The bottom plates of the capacitors are each connected to a separate three-way switch and these switches are connected in parallel to: (1) a $V_{REF}$ bus supplied with the reference voltage ($V_{REF}$); (2) a ground terminal; and (3) a linear string of resistances which generate fractions of $V_{REF}$ and are controlled by additional switches. These latter switches, as well as the three-way lower plate switches, are controlled by a logic circuit, also known as a "Successive Approximation Register" (SAR), connected to the comparator output.

The analog signal is sampled onto the top plates of the capacitors by turning the signal input switch on while the lower plates of all the capacitors in the capacitor array are charged to $V_{REF}$ by turning on their lower plate switches to connect them to the $V_{REF}$ bus. After the signal is acquired in time t, the input switch goes off (while the lower plate switches remain on). The sign of the input data signal is now determined by the comparator. If the sign of the signal is positive, the lower plates are connected to ground and the top plate resample the analog signal. If the sign of the signal is negative, the lower plates are connected to $V_{REF}$, and the top plates resample the analog signal. $V_{REF}$ is assumed to be negative.

The charge redistribution method of analog to digital (A/D) conversion now consists of trying to zero the voltage on the top plate by manipulating the voltages on the lower plate of the capacitor ladder or array. This is achieved by logic circuitry and proper switch control to manipulate voltages on the lower plate of the capacitors in accordance with principles well known to those skilled in the art.

To achieve this, the signal data input switch is opened and the lower plate switches are now turned on selectively to cause voltage changes on the bottom plate of each capacitor in the array, such that it would lead to zero the voltage on its top plate. The allowed changes in voltages on each lower plate consist of $\pm V_{REF}$ or divisions of $\pm V_{REF}$ [i.e., $\pm(n/32) V_{REF} (n=0, 32)$]. The positive or negative swings of $V_{REF}$ are achieved by switching the lower plate from $V_{REF}$ to ground or vice versa. The fractions of $V_{REF}$ that may be required are developed by the linear resistor string and appropriate divisions of $V_{REF}$ are available at the lower plates of all capacitors in the array. Thus, each lower plate may be switched from $\pm n/32 \ V_{REF}$ to ground and vice versa in response to signals from the aforesaid SAR logic circuit.

Other objects, advantages and features of the invention will become apparent from the following detailed description, presented in conjunction with the accompanying drawing.

BRIEF DESCRIPTION OF THE DRAWING

The single FIGURE is a combined block and circuit diagram of a single reference voltage system according to the present invention.

DETAILED DESCRIPTION OF THE EMBODIMENT

With reference to the drawing, the single FIGURE shows a circuit 10 embodying the principles of the present invention that uses a single reference voltage to implement digital to analog or analog to digital conversion of positive or negative signals. The circuit may be part of a CODEC and preferably is implemented as one portion of an integrated circuit device comprised of interconnected resistors, capacitors and metal-oxide-silicon field effect transistor (MOSFET) elements. However, the FIGURE illustrated is sufficient to illustrate the unique features and functions of the invention.

As shown, the analog signal being processed is supplied via an input lead 12 to a filter system typically comprising a high pass filter 14 preferably of the switched capacitor type. The output of this latter filter element output is furnished to the negative input of an operational amplifier 16 that provides the output of the band limiting filter for a typical data sampling system. A feedback lead 18 of this operational amplifier contains another switched capacitor network indicated by the box 20. Connected to the positive input to the operational amplifier 16 via a lead 22 is an autozero loop whose elements are represented by a block 24. This autozero is provided to eliminate offsets in the circuit and such a loop is disclosed in co-pending U.S. application Ser. No. 06/170,041, filed July 18, 1980, on an invention of Yusuf Haque and Richard Blasco entitled "Dual Bandwidth Autozero Loop for Voice Frequency CODEC", which has the same assignee as this application and which is hereby incorporated by reference. Forming part of this offset cancelling loop circuit is a capacitor 26 whose top plate is connected to the lead 22 and whose lower plate is connected to ground. The input to the autozero loop is provided via a lead 28 from a "Successive Approximation Register" (SAR) and control logic network 30 which also provides the analog to digital A/D conversion output for the circuit 40 shown.

The input to the logic and SAR circuit 30 is furnished by a comparator 32 having a pair of inputs. One input to the comparator is connected by a lead 34 to one terminal of a single input switch 36 whose other terminal is connected to the output lead 38 of the operational amplifier 16 supplying the filtered analog input signal. Connected to the lead 34 are the top plates of a number of capacitors 40 which form a capacitor ladder commonly used for analog to digital conversion. These capacitors are progressively different in size so that, commencing with a first capacitor of unitary size C, each next adjacent capacitor has double the capacity, thus, 2C, 4C, 8C, 16C, 32C, 64C and 128C.

The bottom plate of each ladder capacitor is connected to a separate three-terminal switch 42 so that there are as many of these switches as there are capacitors. The first terminal 44 of all of these switches is connected in parallel via a lead 46 to the output lead 48 from a buffer amplifier 50 that supplies the reference voltage. This buffer amplifier receives the original reference voltage on a lead 52 and buffers this voltage by providing a high input impedance so that no significant amount of current is drawn from the original reference voltage source $V_{REF}$ on lead 52.

The output lead 48 from the buffer amplifier is connected to a linear resistor string comprised of a plurality of resistors 54. Preceding each of these resistors is one terminal 56 of a switch 57 whose other terminal 58 is connected to a common lead 60. The other end of this linear resistor string is connected to ground, thus providing a voltage dividing network.

The second terminal 62 of each of the capacitor switches 42 is connected in parallel via a lead 64 that is connected to the common lead 60 of the linear resistor string.

The third terminal 66 for each of the capacitor switches 42 is connected in parallel to a common lead 68 that is connected to the other input to the comparator 32 and also to ground.

The signal input switch 36, the capacitor switches 42 and the resistor connection switches 57 are all shown symbolically as single switches. In practice, all of these switches are preferably implemented as metal-oxide-silicon insulated gate field effect (MOSFET) devices, as are the elements of the various amplifiers, logic circuits and the comparator, so that the circuit can be readily manufactured as an integrated circuit device using conventional design procedures and processes.

The capacitor switches 42 and the resistor connection switches 57 are all controlled by signals from the SAR and control logic circuit 30 via the leads 70 and 72 shown in broken lines.

In the operation of circuit 10, an analog signal received on lead 12 is filtered through the high pass filter network 14 and furnished to the inverting input of the operational amplifier 16. The output of this amplifier, which is essentially the output of the total band limiting filter network, is provided to the sample signal switch 36 which is controlled to open and close periodically by a suitable clock generator of well known design (not shown) as each sample is taken. The signal switch is closed for a time sufficient to allow the upper plate of each capacitor 40 to charge to the sampled analog voltage. Simultaneously, the capacitor switches 42 are all controlled by logic control 30 to be on their first terminal 44 and, therefore, connected to the $V_{REF}$ bus lead 48 to supply the lower plates with the reference voltage. After the analog signal is acquired in time T, the signal switch is opened, but the capacitor switches remain closed. The sign of the signal is now determined by the comparator 32 and if the sign is positive, the top plate of each ladder capacitor resamples the analog signal ($V_{IN}$) by closing switch 36 with the lower plates connected to ground. If the sign of the sampled signal was negative, the top plate of each capacitor resamples the analog signal with its lower plate connected to $V_{REF}$ by control logic 30, assuming that $V_{REF}$ is negative.

The charge redistribution method of analog to digital (A/D) conversion now consists of zeroing the voltage on the top plate of a selected capacitor (the chord) in the capacitor ladder 40. The chord is determined by a sequential technique where the voltage on the lower plate of each capacitor in the array 40, starting with the smallest capacitor, is changed by $-V_{REF}$ (a positive transition, for a negative signal) by switching the lower plate switch 42 of the selected capacitor to ground, or by $+V_{REF}$ (a negative transition, for a positive signal) by switching the lower plate switch 42 of the selected capacitor to $V_{REF}$, until the comparator changes sign. The capacitor selected when the comparator changes sign is called the "chord." Linear resistor string 54 is then used to present various voltages to the bottom plate of the chord in an attempt to zero the voltage on the chord. This voltage on the chord generally is not zeroed when the comparator changes sign when the chord is determined. The available voltages which may be applied to the lower plate consist of $\pm V_{REF}$ or divisions of $\pm V_{REF}$ [i.e., n/32) $V_{REF}$ (n=0, 32)]. The positive or negative swings of $V_{REF}$ for each capacitor are achieved by switching the lower plate from $V_{REF}$ to ground or vice versa. The fractions of $V_{REF}$ that may be required are developed by the linear resistor string and appropriate divisions of $V_{REF}$ are available at the lower plates of the capacitor array. Thus, the lower plate may be switched from $\pm n/32$ $V_{REF}$ to ground and vice versa. By determining which capacitor is the chord, and what fraction of $\pm V_{REF}$ must be applied to the bottom plate of the chord to provide a zero voltage level on line 34, a digital representation of the analog voltage ($V_{IN}$) applied to the input of the analog to digital converter is obtained.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. The method of converting an analog signal to a digital representation of said analog signal utilizing a structure comprising:

input means including an operational amplifier having a first input lead for receiving and filtering an analog input signal at predetermined clocked intervals, a second input lead and an output lead;

an autozero loop including an output lead connected to said second input lead of said operational amplifier, and an input lead;

a bus means having a first end and a second end;

a signal switch connected between said output lead of said operational amplifier and to said first end of said bus means;

a comparator having a first input lead connected to said second end of said bus means, a second input lead connected to ground, and having an output lead;

control logic means connected to said output lead of said comparator and having an output lead connected to said autozero loop input;

a first series of switch means containing a plurality of M switches each having a first, a second and a third terminal;

a capacitor array comprising a plurality of M capacitors, each of said M capacitors having a top and bottom plate, each top capacitor plate being connected to said bus means and each bottom plate being uniquely connected to an associated one of said plurality of M switches contained in said first series of switch means;

a series of resistors connected in series and forming a resistor string, said resistor string having a first end and a second end and a plurality of nodes, one node formed adjacent each resistor in said series;

a single reference voltage source connected to said first end of said resistor string;

a ground reference connected to said second end of said resistor string;

a second series of switches each having two sides, the first side of each switch being uniquely connected to a selected node in said resistor string, and each second side of said second switch means being connected in common;

said first terminal of each of said plurality of M switches being connected directly to said reference voltage, said second terminal of each of said plurality of M switches being connected to said second sides of said second series of switches connected in common, and said third terminal of each of said plurality of M switches being connected to a ground potential for the circuit;

said method comprising the steps of:

connecting said bottom plate of each capacitor in said capacitor array to said reference voltage;

closing said signal switch, thereby sampling said input signal by charging each capacitor in said capacitor array to the sampled analog input signal minus said reference voltage;

opening said signal switch after a time interval sufficient to fully charge the top plates of said capacitor array to said sampled analog input signal;

determining the sign of said input signal stored on said capacitor array;

connecting said bottom plates of said capacitor array to ground, if said input signal stored on said capacitor array is positive or connecting said bottom plates of said capacitor array to said reference voltage if said input signal stored on said capacitor array is negative;

closing said signal switch to resample said input signal by charging said top plates of said capacitor array to said input signal;

determining the "chord" in the capacitor array by switching said bottom plate of each capacitor in said capacitor array starting with the smallest capacitor, from ground to said reference voltage if said input signal was determined to have been positive, or from said reference voltage to ground if said input signal was determined to have been negative, until the comparator changes sign, said chord being the capacitor, when switched, which causes the output signal of said comparator to change sign;

sequentially connecting said bottom plate of said chord to the nodes on said resistor ladder to determine which node provides an output signal of said comparator most nearly equal to zero;

providing a digital representation of said analog input voltage based on the sign of said analog input signal stored on said capacitor array, which capacitor in said capacitor array is the chord, and which node of said resistor ladder when connected to said bottom plate of said chord provides the output signal of said comparator to most nearly equal zero.

2. The method of converting an analog signal to a digital representation of said analog signal utilizing a structure comprising:

an input means for receiving an analog input signal, including an input lead connected to an operational amplifier, a capacitor array wherein each capacitor has a top and a bottom plate, a signal switch connected between the output lead of said operational amplifier and the top plates of said capacitor array, a comparator having a first input lead connected to said top plates of said capacitor array, a second input lead connected to ground and an output lead connected to control logic, a tapped resistor ladder having a plurality of N resistors connected in series and N+1 nodes, including a first and second end, said first end being connected to ground, a single voltage reference connected to said second end of said resistor ladder, and means for switching the bottom plate of each capacitor in said capacitor array to either ground, said reference voltage or one of said plurality of nodes on said resistor ladder;

said method comprising the steps of:

connecting said bottom plate of each capacitor in said capacitor array to said reference voltage;

closing said signal switch, thereby sampling said input signal by charging each capacitor in said capacitor array to the sampled analog input voltage minus said reference voltage;

opening said signal switch after a time interval sufficient to fully charge the top plates of said capacitor array to said sampled analog input signal;

determining the sign of said input signal stored on said capacitor array;

connecting said bottom plates of said capacitor array to ground, if said input signal stored on said capacitor array is positive or connecting said bottom plates of said capacitor array to said reference voltage if said input signal stored on said capacitor array is negative;

closing said signal switch to resample said input signal by charging said top plates of said capacitor array to said input signal;

determining the "chord" in the capacitor array by switching said bottom plate of each capacitor in said capacitor array starting with the smallest capacitor, from ground to said reference voltage if said input signal was determined to have been positive, or from said reference voltage to ground if said input signal was determined to have been negative, until the comparator changes sign, said chord being the capacitor, when switched, which causes the output signal of said comparator to change sign;

sequentially connecting said bottom plate of said chord to the nodes on said resistor ladder to determine which node provides an output signal of said comparator most nearly equal to zero;

providing a digital representation of said analog input signal based on the sign of said analog input signal stored on said capacitor array, which capacitor in said capacitor array is the chord, and which node of said resistor ladder when connected to said bottom plate of said chord provides the output signal of said comparator to most nearly equal zero.

3. An analog to digital conversion circuit for converting both positive and negative analog signals to digital form comprising:

input means including an operational amplifier having a first input lead for receiving and filtering an analog input signal at predetermined clocked intervals, a second input lead and an output lead;

an autozero loop including an output lead connected to said second input lead of said operational amplifier, and an input lead;

a bus means having a first end and a second end;

a signal switch connected between said output lead of said operational amplifier and to said first end of said bus means;

a comparator having a first input lead connected to said second end of said bus means, a second input lead connected to ground, and having an output lead;

control logic means connected to said output lead of said comparator and having an output lead connected to said autozero loop input;

a first series of switch means containing a plurality of M switches each having a first, a second and a third terminal, a capacitor array comprising a plurality of M capacitors, each of said M capacitors having a top and bottom plate, each top capacitor plate being connected to said bus means and each bottom plate being uniquely connected to an associated one of said plurality of M switches contained in said first series of switch means;

a series of resistors connected in series and forming a resistor string, said resistor string having a first end and a second end and a plurality of nodes, one node formed adjacent each resistor in said series;

a single reference voltage source connected to said first end of said resistor string;

a ground reference connected to said second end of said resistor string;

a second series of switches each having two sides, the first side of each switch being uniquely connected to a selected node in said resistor string, and each second side of said second switch means being connected in common;

said first terminal of each of said plurality of M switches being connected directly to said reference voltage, said second terminal of each of said plurality of M switches being connected to said second sides of said second series of switches connected in common, and said third terminal of each of said plurality of M switches being connected to a ground potential for the circuit;

whereby said control logic is connected to selectively manipulate each of said first series and said second series of switches so as to:

determine the "chord" in said capacitor array by switching said bottom plate of each capacitor in said capacitor array starting with the smallest capacitor, from ground to said reference voltage if said input signal was determined to have been positive, or from said reference voltage to ground if said input signal was determined to have been negative, until the output signal of said comparator changes sign, said chord being the capacitor, when switched, which causes said output signal of said comparator to change sign;

sequentially connect said bottom plate of said chord to said nodes of said resistor string to determine which node provides an output signal of said comparator most nearly equal to zero; and provide a digital representation of said analog input signal based on the sign of said analog input signal stored on said capacitor array, which capacitor in said capacitor array is the chord and which node of said resistor string when connected to said bottom plate of said chord provides said output signal of said comparator to most nearly equal zero.

4. Structure as in claim 3 wherein said resistor string is comprised of N resistors connected in series, each resistor being of approximately equal resistance value, and wherein said resistor string contains N+1 nodes, said first node being at the end of said resistor string connected to said voltage reference, said ith node being at the point of interconnection between said ith−1 resistor and said ith resistor, and wherein said N+1 node is at the point where said nth resistor is connected to ground.

5. An analog to digital conversion circuit for converting both positive and negative analog signals, said circuit containing an input means for receiving an analog input signal, including an input lead connected to an operational amplifier, a capacitor array wherein each capacitor has a top and a bottom plate, a signal switch connected between the output lead of said operational amplifier and the top plates of said capacitor array, a comparator having a first input lead connected to said top plates of said capacitor array, a second input lead connected to ground and an output lead connected to control logic, a tapped resistor ladder having a plurality of N resistors connected in series and N+1 nodes, including a first and second end, said first end being connected to ground, wherein the improvement comprises:

a single voltage reference connected to said second end of said resistor ladder;
  means for switching the bottom plate of each capacitor in said capacitor array to either ground, said reference voltage or one of said plurality of nodes on said resistor ladder;
  whereby said control logic manipulates said signal switch and said switch means so as to:
  determine the "chord" in said capacitor array by switching said bottom plate of each capacitor on said capacitor array starting with the smallest capacitor, from ground to said reference voltage if said input signal was determined to have been positive, or from said reference voltage to ground if said input signal was determined to have been negative, until the output signal of said comparator changes sign, said chord being the capacitor, when switched, which causes said output signal of said comparator to change sign;
  sequentially connect said bottom plate of said chord to said nodes of said resistor string to determine which node provides an output signal of said comparator most nearly equal to zero;
  provide a digital representation of said analog input signal based on the sign of said analog input signal stored on said capacitor array, which capacitor in said capacitor array is the chord and which node of said resistor string when connected to said bottom plate of said chord provides said output signal of said comparator to most nearly equal zero.

6. Structure as in claims 3 or 5 wherein said analog to digital conversion circuit is constructed as a monolithic semiconductor device.

7. Structure as in claims 3 or 5 wherein said switches and switch means comprise metal oxide semiconductor transistors.

* * * * *

UNITED STATES PATENT AND TRADEMARK OFFICE
CERTIFICATE OF CORRECTION

PATENT NO. : 4,385,286
DATED : May 24, 1983
INVENTOR(S) : Yusuf A. Haque

It is certified that error appears in the above—identified patent and that said Letters Patent is hereby corrected as shown below:

In Column 2, line 27, between "time" and "the", delete "t," and insert --T,--;

In column 2, line 31, delete "plate" and insert --plates--;

In Column 3, line 22, between "18" and "this", delete "of" and insert --for--;

In Column 5, line 3, delete "i.e., n/32) $V_{REF}$" and insert --i.e., n/32 $V_{REF}$--.

Signed and Sealed this

Ninth Day of August 1983

[SEAL]

Attest:

GERALD J. MOSSINGHOFF

*Attesting Officer*    *Commissioner of Patents and Trademarks*